United States Patent
Sonderman et al.

(10) Patent No.: US 6,617,258 B1
(45) Date of Patent: Sep. 9, 2003

(54) METHOD OF FORMING A GATE INSULATION LAYER FOR A SEMICONDUCTOR DEVICE BY CONTROLLING THE DURATION OF AN ETCH PROCESS, AND SYSTEM FOR ACCOMPLISHING SAME

(75) Inventors: Thomas J. Sonderman, Austin, TX (US); Matthew Ryskoski, Kyle, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/911,289

(22) Filed: Jul. 23, 2001

(51) Int. Cl.[7] ............................................. H01L 21/302
(52) U.S. Cl. ....................................... 438/749; 118/695
(58) Field of Search ................................. 438/591–592, 438/594, 596, 197, 285, 216, 261, 585, 287, 275, 751, 749; 118/695–699

(56) References Cited

U.S. PATENT DOCUMENTS

| | | | | |
|---|---|---|---|---|
| 5,776,821 A | * | 7/1998 | Haskell et al. | 438/585 |
| 5,801,081 A | * | 9/1998 | Warashina et al. | 438/410 |
| 5,920,784 A | * | 7/1999 | Lee | 438/307 |
| 6,245,652 B1 | * | 6/2001 | Gardner et al. | 438/592 |
| 6,258,681 B1 | * | 7/2001 | Fulford et al. | 438/305 |
| 6,409,879 B1 | * | 6/2002 | Toprac et al. | 156/345.24 |

* cited by examiner

Primary Examiner—David Nelms
Assistant Examiner—David Vu
(74) Attorney, Agent, or Firm—Williams, Morgan & Amerson, P.C.

(57) ABSTRACT

In one illustrative embodiment, the method comprises providing a substrate having a process layer formed thereabove, performing a wet etching process comprised of a duration parameter on the process layer to reduce a thickness of the process layer, and adjusting the duration parameter of the wet etching process if the reduced thickness of the process layer after the etching process is complete is not within acceptable limits. In another illustrative embodiment, the present invention is directed to a system that is comprised of an etch tool for performing an etching process for a duration on a process layer formed above a semiconducting substrate to reduce a thickness of the process layer, and a controller for adjusting the duration of the etching process if the reduced thickness of the process layer after the etching process is performed is not within acceptable limits.

20 Claims, 2 Drawing Sheets

METHOD OF FORMING A GATE INSULATION LAYER FOR A SEMICONDUCTOR DEVICE BY CONTROLLING THE DURATION OF AN ETCH PROCESS, AND SYSTEM FOR ACCOMPLISHING SAME

BACKGROUND OF THE INVENTION

1. Field of the Invention

This invention relates generally to semiconductor fabrication technology, and, more particularly, to a method of forming a gate insulation layer for a semiconductor device by controlling the duration of an etch process, and a system for accomplishing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

By way of background, an illustrative field effect transistor 10, as shown in FIG. 1, may be formed above a surface 15 of a semiconducting substrate or wafer 11 comprised of doped-silicon. The substrate 11 may be doped with either N-type or P-type dopant materials. The transistor 10 may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown).

In the process of forming integrated circuit devices, millions of transistors, such as the illustrative transistor 10 depicted in FIG. 1, are formed above a semiconducting substrate 11. In general, semiconductor manufacturing operations involve, among other things, the formation of layers of various materials, e.g., polysilicon, insulating materials, etc., and the selective removal of portions of those layers by performing known photolithographic and etching techniques. These processes are continued until such time as the integrated circuit device is complete. Additionally, although not depicted in FIG. 1, a typical integrated circuit device is comprised of a plurality of conductive interconnections, such as conductive lines and conductive contacts or vias, positioned in multiple layers of insulating material formed above the substrate. These conductive interconnections allow electrical signals to propagate between the transistors formed above the substrate.

During the course of fabricating such integrated circuit devices, a variety of features, e.g., gate electrodes, conductive lines, openings in layers of insulating material, etc., are formed to very precisely controlled dimensions. Such dimensions are sometimes referred to as the critical dimension (CD) of the feature. It is desirable in modern semiconductor processing that features be formed accurately due to the reduced size of those features in such modern devices. For example, gate electrodes may now be patterned to a width 12 that is approximately 0.18 μm (1800 Å), and further reductions are planned in the future. In general, the width 12 of the gate electrode 14 corresponds approximately to the channel length 13 of the transistor 10 when it is operational. Thus, even slight variations in the actual dimension of the feature as fabricated may adversely affect device performance. Thus, there is a great desire for a method that may be used to accurately, reliably and repeatedly form features to their desired critical dimension, i.e., to form the gate electrode 14 to its desired critical dimension 12.

Another factor that may affect transistor performance is the thickness of the gate insulation layer 16. As stated above, there are constant efforts to increase the operating speed of transistor devices so as to improve the overall performance of integrated circuit devices made from such transistors. All other things being equal, the thinner the gate insulation layer 16, the faster the transistor 10 will operate. Thus, there is a great desire to form very thin gate insulation layers 16 that are of acceptable quality. Typically, in current-generation transistors, the gate insulation layer 16 may have a thickness ranging from approximately 2–12 nm (20–120 Å), and further reductions are anticipated in the future as manufacturing technologies and/or materials improve.

The gate insulation layer 16 may be made from a variety of materials and by a variety of techniques. In many modern silicon-based transistors, the gate insulation layer 16 is comprised of a layer of silicon dioxide that is formed by an oxidation process in a furnace. In some applications, efforts have been made to form the gate insulation layer 16 by various deposition processes, e.g., chemical vapor deposition ("CVD"). However, semiconductor manufacturers continue to search for methods of manufacturing very thin, high-quality gate insulation layers 16 in a reliable manner that may be used in high volume production runs in a semiconductor manufacturing environment.

The present invention is directed to a method and system that may solve, or at least reduce, some or all of the aforementioned problems.

SUMMARY OF THE INVENTION

In general, the present invention is directed to a method of forming a gate insulation layer for a semiconductor device by controlling the duration of an etch process, and a system for accomplishing same. In one illustrative embodiment, the method comprises providing a substrate having a process layer formed thereabove, performing a wet etching process comprised of a duration parameter on the process layer to reduce a thickness of the process layer, and adjusting the duration parameter of the wet etching process if the reduced thickness of the process layer after the etching process is complete is not within acceptable limits.

In another illustrative embodiment, the present invention is directed to a system that is comprised of an etch tool for performing an etching process for a duration on a process layer formed above a semiconducting substrate to reduce a thickness of the process layer, and a controller for adjusting the duration of the etching process if the reduced thickness of the process layer after the etching process is performed is not within acceptable limits.

BRIEF DESCRIPTION OF THE DRAWINGS

The invention may be understood by reference to the following description taken in conjunction with the accompanying drawings, in which like reference numerals identify like elements, and in which.

Figure 1:
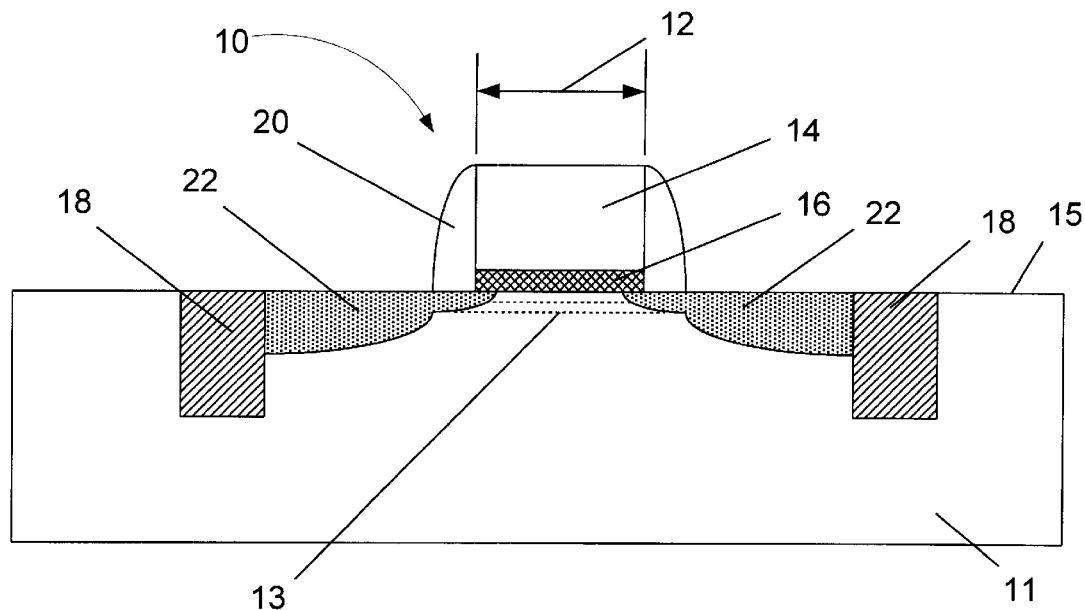
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives failing within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to forming a gate insulation layer for a transistor device by controlling the duration of an etching process used to reduce the thickness of an initially formed process layer, thereby resulting in the formation of the gate insulation layer, and a system for accomplishing same. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

Semiconductor manufacturing generally involves multiple processes whereby multiple layers of material are formed above a semiconducting substrate, and portions of those layers are selectively removed until such time as a completed device is formed. Many types of processes may be involved in forming integrated circuit devices, e.g., deposition processes, etching processes, thermal growth processes, photolithography processes, and heating processes. As set forth in the background section of this application, proper formation of a gate insulation layer for a transistor is very important to the ultimate performance of the transistor device.

Figure 2:
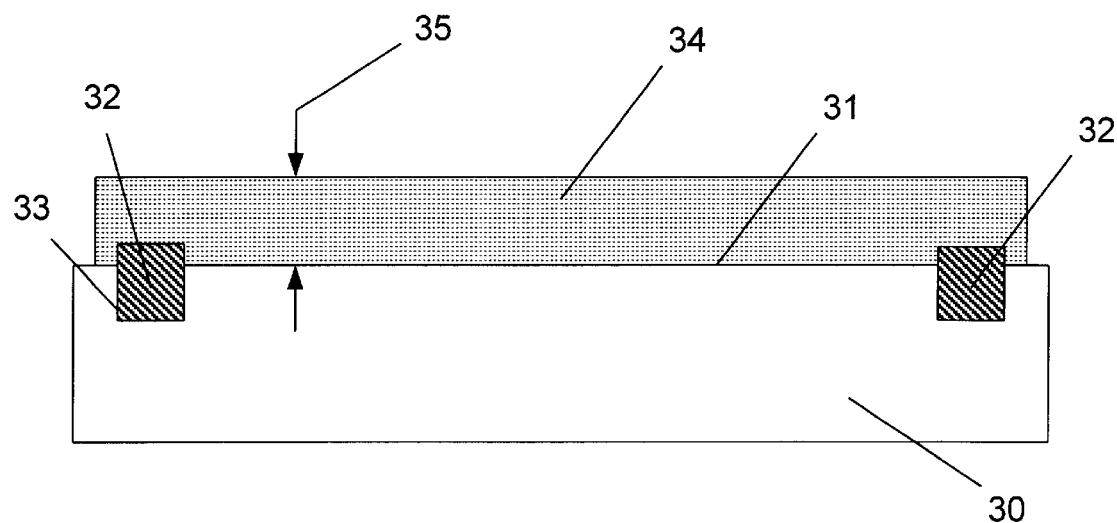
FIG. 2 is a cross-sectional view of an illustrative substrate having a process layer formed thereabove.
Figure 3:
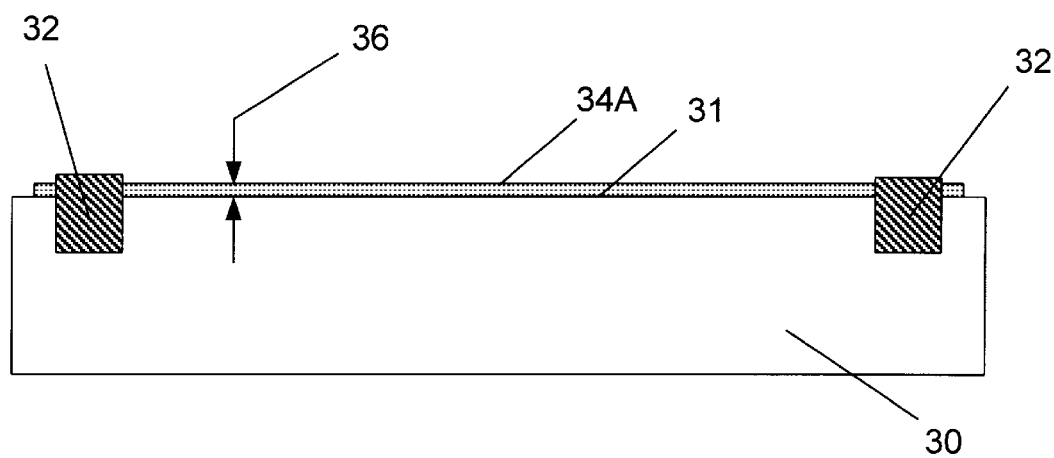
FIG. 3 is a cross-sectional view of the device of FIG. 2 after the process layer has been thinned to form a gate insulation layer.

FIGS. 2 and 3 will now be referenced in describing various steps and methodologies in accordance with one embodiment of the present invention. As shown in FIG. 2, a plurality of trench isolation structures 32 are formed in a semiconducting substrate 30 and a process layer 34 is formed above a surface 31 of the substrate 30.

The substrate 30 may be comprised of any type of semiconducting material, e.g., doped silicon. The trench isolation structures 32 may be comprised of a variety of materials and may be formed by a variety of known techniques. For example, the trench isolation structures 32 may be formed by initially forming a trench 33 in the substrate 30, and, thereafter, filling the trench 33 with an appropriate material, such as silicon dioxide, silicon oxynitride, silicon nitride, etc. In some embodiments of the present invention, the material comprising the trench isolation structure 32 is selected such that there is a degree of etch selectivity between the trench isolation structure 32 and the material comprising the process layer 34. Of course, traditional isolation structures formed by a LOCOS process may be used in lieu of the trench isolation structure 32 depicted in FIG. 2.

The process layer 34 may be formed from a variety of materials and it may be formed by a variety of techniques. Ultimately, the process layer 34 will be thinned by an etching process to produce a gate insulation layer 34A (see FIG. 3). Thus, the material selected for the process layer 34 should be suitable for use as a gate insulating layer in modern transistors. For example, the process layer 34 may be comprised of silicon dioxide, silicon nitride, silicon oxynitride, or a material having a dielectric constant less than 5.0. The process layer 34 may be formed by a variety of techniques, e.g., chemical vapor deposition ("CVD"), physical vapor deposition ("PVD"), plasma enhanced chemical vapor deposition ("PECVD"), etc. Moreover, the initial thickness of the process layer 34 may vary. In one particular illustrative embodiment, the trench isolation structures 32 are comprised of silicon oxide, and the process layer 34 is comprised of silicon dioxide formed to a thickness 35 of approximately 2–12 nm by a thermal oxidation process.

Next, an etching process is performed to reduce the original thickness 35 of the process layer 34, thereby resulting in the formation of gate insulation layer 34A depicted in FIG. 3. The thickness 36 of the gate insulation layer 34A may vary depending upon the device under construction. For example, the thickness 36 of the gate insulation layer 34A after etching may range from approximately 2–6 nm.

Figure 4:
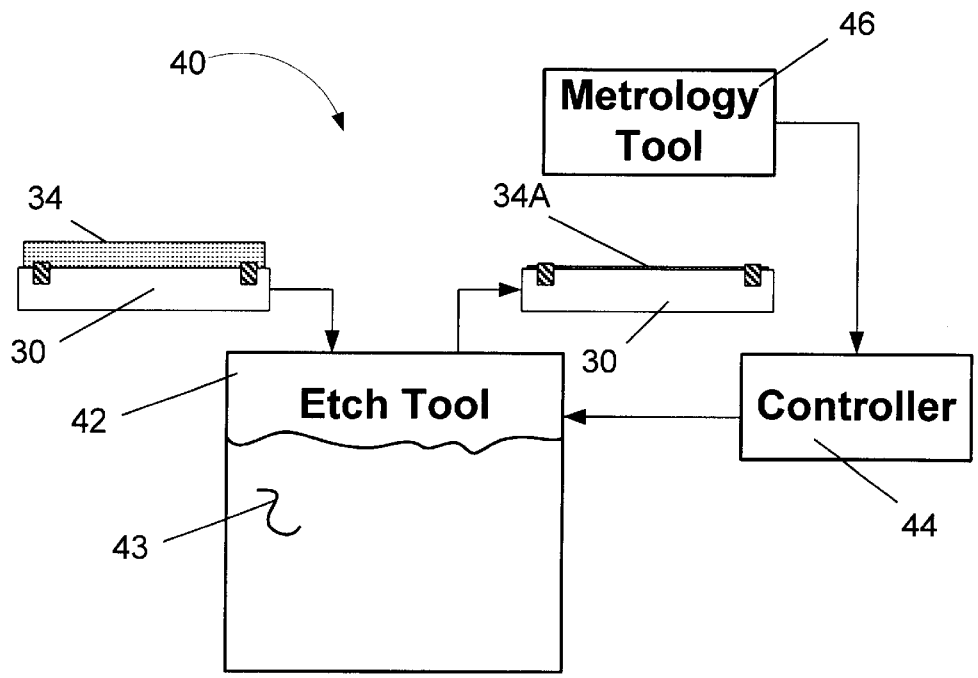
FIG. 4 depicts an illustrative embodiment of a system in accordance with one embodiment of the present invention.

The process layer 34 is thinned to the desired final thickness 36 by performing an etching process, typically a wet etching process. FIG. 4 depicts an illustrative system 40 that may be used in accordance with the present invention. The illustrative system 40 is comprised of an etching tool 42, a controller 44 and a metrology tool 46. The etch tool 42 contains an etch bath 43 comprised of any of a variety of etchants that will be used to reduce the thickness 35 of the process layer 34. In general, a substrate 30, having a process layer 34 formed thereabove, will be sent to the etch tool 42 where etching operations will be performed for a fixed duration to reduce the thickness 35 of the process layer 34. Thereafter, as a result of the etching process, the gate insulation layer 34A is formed, and the substrate 30 is removed from the etch tool 42.

After etching, the substrate 30 may be sent to the metrology tool 46 where the thickness 36 of the gate insulation layer 34A may be measured or determined. The metrology data may be provided to the controller 44. If the thickness 36 of the gate insulation layer 34A is not within acceptable limits, e.g., a preselected value or range of values, i.e., if the measured thickness 36 is not within product specifications, the duration of the etching process to be performed on a subsequent substrate 30 having a process layer 34 formed thereabove is adjusted. That is, if performing the etching process for the originally selected duration of the process results in a gate insulation layer 34A that is too thick, the duration of the etching process performed on a subsequently processed substrate 30 may be increased. Alternatively, if the gate insulation layer 34A is too thin, the duration of the etching process may be reduced. The magnitude of the incremental increases or decreases in the duration of the etching process, as the case may warrant, may vary. However, given the very thin gate insulation layers used in modem transistors, the increment may be on the order of approximately 0.01 second.

The initial duration of the etching process performed in the etch tool 42 may vary depending upon the initial thickness 35 of the process layer 34, the material comprising the process layer 34, the composition and concentration of etchants in the etch bath 43, and the desired final thickness 36 of the gate insulation layer 34A. In one particularly illustrative embodiment where the process layer 34 is comprised of silicon dioxide having a thickness of approximately 2–12 nm, the desired final thickness 36 of the gate insulation layer 34A is approximately 2–6 nm, the etch bath 43 is a dilute hydrofluoric (HF) acid bath at a concentration of approximately 100:1, the duration of the etch process may range from approximately 80–120 seconds. Thereafter, the duration of the etch process to be performed on subsequently processed substrates may be adjusted based upon the metrology data obtained by the metrology tool 46 as to the thickness 36 of the gate insulation layer 34A.

Of course, the etching process performed in the etch tool 42 may be performed on a lot-by-lot basis or on a substrate-by-substrate basis. Moreover, the measurement of the thickness 36 of the gate insulation layer 34A need not be measured on every substrate 30 nor after every etching process is performed. Rather, the frequency of the measurements, as well as the locations where the gate insulation layer 34A is measured, may be varied based upon the judgment of the appropriate process engineer.

The etch tool 42 may be any type of processing tool capable of performing the desired etch process on the process layer 34. For example, a UW8000 etch tool manufactured by Tokyo Electron (TEL) may be used. The composition of the etch bath 43 may also vary in terms of the etchants used as well as their concentration. For example, the etchants used in the etch bath 43 may vary depending upon the materials selected for the process layer 34 and the trench isolation regions 32. The concentration of the etchant chemicals in the etch bath 43 may vary depending upon the desired removal rate. In one illustrative embodiment, where the process layer 34 is comprised of a deposited layer of silicon dioxide, the etch bath 43 is comprised of hydrofluoric acid diluted at a ratio of approximately 100:1.

The metrology tool 46 may be any type of tool capable of measuring the thickness 36 of the gate insulation layer 34A. For example, the metrology tool 46 may be an ellipsometer, a spectrophotometer, a spectroscopic ellipsometer, an interferometer, etc. The metrology tool 46 may be a stand-alone tool, or it may be integrated with the etch tool 42.

In the illustrated embodiments, the controller 44 is a computer programmed with software to implement the functions described herein. Moreover, the functions described for the controller 44 may be performed by one or more controllers spread through the system. For example, the controller 44 may be a fab level controller that is used to control processing operations throughout all or a portion of a semiconductor manufacturing facility. Alternatively, the controller 44 may be a lower level computer that controls only portions or cells of the manufacturing facility. Moreover, the controller 44 may be a stand-alone device, or it may reside on the etch tool 42 or the metrology tool 46. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 44, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

The present invention is generally directed to a method of forming a gate insulation layer for a semiconductor device by controlling the duration of an etch process, and a system for accomplishing same. In one illustrative embodiment, the method comprises providing a substrate 30 having a process layer 34 formed thereabove, performing a wet etching process comprised of a duration parameter on the process layer 34 to reduce a thickness of the process layer 34, and adjusting the duration parameter of the wet etching process after the etching process is complete if the reduced thickness 36 of the process layer is not within acceptable limits.

In another illustrative embodiment, the present invention is directed to a system 40 that is comprised of an etch tool 42 for performing an etching process for a duration on a process layer 34 formed above a semiconducting substrate to reduce a thickness of the process layer 34, and a controller for adjusting the duration of the etching process if the reduced thickness 36 of the process layer after the etching process is performed is not within acceptable limits.

In another illustrative embodiment, the present invention is directed to a system 40 that is comprised of a means for performing an etching process for a duration on a process layer formed above a semiconducting substrate to reduce a thickness of the process layer 34, and a controller means for adjusting the duration of the etching process if the reduced thickness 36 of the process layer after the etching process is performed is not within acceptable limits. In the disclosed embodiment, the means for performing the etching process is the etch tool 42, and the controller means is the controller 44.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a substrate having a process layer formed thereabove;
   performing a wet etching process comprised of a duration parameter on said process layer to reduce a thickness of said process layer to thereby form a gate insulation layer for an integrated circuit device;
   adjusting said duration parameter of said wet etching process if said reduced thickness of said process layer after said etching process is complete is not within acceptable limits; and
   performing said wet etching process comprised of said adjusted duration parameter on a process layer formed on at least one subsequently processed substrate to thereby form a gate insulation layer for an integrated circuit device formed on said subsequently processed substrate.

2. The method of claim 1, wherein providing a substrate having a process layer formed thereabove comprises providing a substrate comprised of silicon having a process layer formed thereabove.

3. The method of claim 1, wherein providing a substrate having a process layer formed thereabove comprises providing a substrate having a process layer formed thereabove by a deposition process.

4. The method of claim 1, wherein providing a substrate having a process layer formed thereabove comprises providing a substrate having a process layer comprised of at least one of silicon dioxide, silicon nitride, silicon oxynitride, and a material having a dielectric constant less than 5.0 formed thereabove.

5. The method of claim 1, wherein performing a wet etching process comprises performing a wet etching process in a dilute hydrofluoric acid bath.

6. The method of claim 1, wherein performing a wet etching process comprised of a duration parameter on said process layer to reduce a thickness of said process layer comprises performing a wet etching process comprised of a duration parameter on said process layer to reduce a thickness of said process layer to a thickness of approximately 2–6 nm.

7. The method of claim 1, wherein adjusting said duration parameter of said wet etching process if said reduced thickness of said process layer after said etching process is complete is not within acceptable limits comprises adjusting said duration parameter of said wet etching process if said reduced thickness of said process layer after said etching process is complete is not within a preselected range.

8. The method of claim 1, further comprising measuring said reduced thickness of said process layer after said etching process is performed and providing said measured thickness to a controller.

9. A method, comprising:
   providing a substrate comprised of silicon having a process layer comprised of at least one of silicon dioxide, silicon nitride, silicon oxynitride, and a material having a dielectric constant less than 5.0 formed thereabove;
   performing a wet etching process comprised of a duration parameter on said process layer to reduce a thickness of said process layer to thereby form a gate insulation layer for an integrated circuit device;
   adjusting said duration parameter of said wet etching process if said reduced thickness of said process layer after said etching process is complete is not within a preselected range; and
   performing said wet etching process comprised of said adjusted duration parameter on a process layer formed on at least one subsequently processed substrate to thereby form a gate insulation layer for an integrated circuit device formed on said subsequently processed substrate.

10. The method of claim 9, wherein providing a substrate having a process layer formed thereabove comprises providing a substrate having a process layer formed thereabove by a deposition process.

11. The method of claim 9, wherein performing a wet etching process comprises performing a wet etching process in a dilute hydrofluoric acid bath.

12. The method of claim 9, wherein performing a wet etching process comprised of a duration parameter on said process layer to reduce a thickness of said process layer comprises performing a wet etching process comprised of a duration parameter on said process layer to reduce a thickness of said process layer to a thickness of approximately 2–6 nm.

13. The method of claim 9, further comprising measuring said reduced thickness of said process layer after said etching process is performed and providing said measured thickness to a controller.

14. A method, comprising:

providing a substrate;

thermally growing a process layer comprised of silicon dioxide above said substrate;

performing a wet etching process comprised of a duration parameter on said process layer to reduce a thickness of said process layer to thereby form a gate insulation layer for an integrated circuit device, said wet etching process being performed in an etch bath comprised of hydrofluoric acid;

adjusting said duration parameter of said wet etching process if said reduced thickness of said process layer after said etching process is complete is not within acceptable limits; and performing said wet etching process comprised of said adjusted duration parameter on a process layer formed on at least one subsequently processed substrate to thereby form a gate insulation layer for an integrated circuit device formed on said subsequently processed substrate.

15. The method of claim 14, wherein providing a substrate comprises providing a substrate comprised of silicon.

16. The method of claim 14, wherein performing a wet etching process comprised of a duration parameter on said process layer to reduce a thickness of said process layer comprises performing a wet etching process comprised of a duration parameter on said process layer to reduce a thickness of said process layer to approximately 2–6 nm.

17. The method of claim 14, wherein adjusting said duration parameter of said wet etching process if said reduced thickness of said process layer after said etching process is complete is not within acceptable limits comprises adjusting said duration parameter of said wet etching process if said reduced thickness of said process layer after said etching process is complete is not within a preselected range.

18. The method of claim 14, wherein thermally growing a process layer comprised of silicon dioxide comprises thermally growing a process layer comprised of silicon dioxide to a thickness of approximately 3–12 nm and performing said wet etching process to reduce said thickness of said process layer to approximately 2–6 nm.

19. A method, comprising:

providing a substrate having a process layer formed thereabove;

performing a wet etching process comprised of a duration parameter on said process layer to reduce a thickness of said process layer to thereby form a gate insulation layer for an integrated circuit device;

measuring said reduced thickness of said process layer after said etching process is performed;

adjusting said duration parameter of said wet etching process if said measured thickness of said process layer after said etching process is complete is not within acceptable limits; and performing said wet etching process comprised of said adjusted duration parameter on a process layer formed on at least one subsequently processed substrate to thereby form a gate insulation layer for an integrated circuit device formed on said subsequently processed substrate.

20. The method of claim 19, wherein said integrated circuit device is a transistor.

* * * * *